(12) United States Patent
Ware et al.

(10) Patent No.: US 8,649,460 B2
(45) Date of Patent: Feb. 11, 2014

(54) TECHNIQUES FOR MULTI-WIRE ENCODING WITH AN EMBEDDED CLOCK

(75) Inventors: Frederick Ware, Los Altos Hills, CA (US); Jade Kizer, Windsor, CO (US)

(73) Assignee: Rambus Inc., Sunnyvale, CA (US)

( * ) Notice: Subject to any disclaimer, the term of this patent is extended or adjusted under 35 U.S.C. 154(b) by 915 days.

(21) Appl. No.: 12/663,230

(22) PCT Filed: Jun. 4, 2008

(86) PCT No.: PCT/US2008/065809
§ 371 (c)(1),
(2), (4) Date: Mar. 11, 2010

(87) PCT Pub. No.: WO2008/151251
PCT Pub. Date: Dec. 11, 2008

(65) Prior Publication Data
US 2010/0215118 A1    Aug. 26, 2010

Related U.S. Application Data

(60) Provisional application No. 60/941,997, filed on Jun. 5, 2007.

(51) Int. Cl.
*H04L 27/00* (2006.01)
(52) U.S. Cl.
USPC ........... 375/295; 375/268; 375/300; 710/100
(58) Field of Classification Search
USPC .......... 375/268, 295, 300, 165, 178; 710/100
See application file for complete search history.

(56) References Cited

U.S. PATENT DOCUMENTS

| 6,396,329 | B1 | 5/2002 | Zerbe |
| 7,099,400 | B2 | 8/2006 | Yang et al. |
| 2002/0091948 | A1 | 7/2002 | Werner et al. |
| 2006/0061405 | A1* | 3/2006 | Zerbe ............................ 327/336 |
| 2006/0242483 | A1 | 10/2006 | Werner et al. |

OTHER PUBLICATIONS

International Search Report in International Application No. PCT/US2008/065809, mailed Aug. 27, 2008.
International Preliminary Examination Report mailed Sep. 4, 2009 for International Application No. PCT/US08/65809.
EP Extended European Search Report dated Jun. 26, 2013 in EP Application No. 08770125.6. 11 pages.

* cited by examiner

*Primary Examiner* — Curtis Odom
(74) *Attorney, Agent, or Firm* — Hunton & Williams LLP

(57) ABSTRACT

Techniques for multi-wire encoding with an embedded clock are disclosed. In one particular exemplary embodiment, the techniques may be realized as a transmitter component. The transmitter component may comprise at least one encoder module to generate a set of symbols, each symbol being represented by a combination of signal levels on a set of wires. The transmitter component may also comprise at least one signaling module to transmit one or more of the symbols over the set of wires according to a transmit clock. The transmitter component may additionally comprise control logic to restrict transmission of first and second subsets of the set of symbols to respective first and second portions of a clock cycle of the transmit clock, such that a signal differential among at least two of the set of wires exhibits a switching behavior that has a same frequency as the transmit clock.

14 Claims, 10 Drawing Sheets

TECHNIQUES FOR MULTI-WIRE ENCODING WITH AN EMBEDDED CLOCK

FIELD OF THE DISCLOSURE

The present disclosure relates generally to electronic devices and data communications therewith, and, more particularly, to techniques for multi-wire encoding with an embedded clock.

BACKGROUND OF THE DISCLOSURE

Modern memory devices, such as double data rate (DDR) and graphics double data rate (GDDR) memory devices, typically require a reliable timing control for high-speed operations. At least three types of timing control architectures are currently in use or have been proposed—strobed timing (or "source synchronous timing"), clocked timing, and clock-data-recovery or "clock and data recovery" (CDR). Each of these known approaches has disadvantages which may limit its use in high-performance applications.

In a typical strobed timing architecture, a memory controller (e.g., a graphics processing unit or "GPU") may be coupled to a DDR or GDDR memory device via a bi-directional data bus, and a pair of strobe paths may run in parallel with the data bus to provide timing control for high-speed data exchange between the memory controller and the memory device. In operation, the memory controller may assert a first strobe signal (or "write strobe") on one strobe path to provide a timing reference for every transmission of data to the memory device. The memory device may assert a second strobe signal (or "read strobe") on the other strobe path to provide a timing reference for every transmission of data to the memory controller. With this timing arrangement, the receiving device (i.e., the memory controller during a read operation or the memory device during a write operation) can have a timing reference which is in a controlled phase relationship with the data signal received.

One disadvantage of the traditional strobed timing architecture lies in the requirement of extra wires and related circuitry which are dedicated to the transmission and detection of strobe signals. In addition, the electrical lengths of timing paths (for strobe signals) and data paths (for data signals) must be matched or equalized to avoid skews between the strobe and data signals. This additional requirement tends to increase the complexity of laying out strobe-based memory controllers and memory devices on circuit boards.

Some higher-performance memory devices operate based on a clocked timing architecture and include timing circuitry to generate an internal clock based on a master clock supplied by a memory controller. Write data signals are not sampled according to the timing of write strobe signals but in reference to an internal receive clock signal at the memory. Similarly, read data signals are not sampled according to the timing of read strobe signals but in reference to a receive clock signal at the memory controller.

Compared with the strobed timing architectures, the mismatch between timing paths and data paths is no longer an issue for the clocked timing architecture. However, clocked timing requires proper phase maintenance for the transmit and receive clocks in order to sample data signals correctly at the memory and the memory controller. The phase maintenance circuitry may be costly to design and consumes additional chip power. The phase maintenance requirement may be difficult to satisfy when environmental drift components are present in the memory device to cause continual phase drifts in its local clock. Furthermore, tracking of the phase drifts may be too slow to satisfy high-performance needs of modern data memory devices.

In a typical clock-data-recovery (CDR) architecture, a receiver may receive a data stream without an accompanying clock signal or any other timing signals. The receiver may generate a clock from an approximate frequency reference and then phase-align to the transitions in the data stream with a phase-locked loop (PLL). This clock recovery scheme is effective only when the data stream has a sufficiently high transition frequency. To ensure frequent transitions, some encoding scheme may be implemented on the data stream, such as the well-known 8B/10B encoding method which maps 8-bit data to a 10-bit symbol.

While it does not involve any dedicated signaling path or any clock phase maintenance, the CDR architecture still requires dedicated clock phase extraction circuitry (e.g., PLL). The 8B/10B encoding not only leads to overhead costs, but also reduces useful bandwidth.

In view of the foregoing, it would be desirable to provide a technique for improved timing control of electronic devices which overcomes the above-described inadequacies and shortcomings.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENTS

Embodiments of the present disclosure provide improved timing control techniques for data communications among electronic components. A transmitter component may encode a set of symbols according to a multi-wire encoding scheme and, with the timing control of a transmit clock, transmit the encoded symbols to a receiver component over a set of wires. The transmitter may also restrict the transmission of a first subset of the encoded symbols to a first portion of a clock cycle associated with the transmit clock and restrict the transmission of a second subset of the encoded symbols to a second portion of the clock cycle. As a result of theses restrictions, a clock signal may become embedded in the multi-wire encoded transmission. The embedded clock signal may be recovered by the receiver component and serve as a receive clock for the reception and decoding of the encoded symbols.

While most of the description that follows will focus on communications between a memory controller and a memory device (e.g., dynamic random access memory (DRAM), double-data-rate (DDR) memory, or graphic DDR (GDDR) memory), the techniques are not limited to memory controllers or memory devices. For example, the techniques may be generally applicable to high-speed data communications between two or more electronic components (e.g., between a master device and one or more slave devices). Also, it should be noted that, although specific types of analog and digital devices (e.g., transistors, resistors, gates and latches) are shown in the figures for illustration purposes, many of these devices may be replaced with functionally equivalent devices without departing from the spirit of the present disclosure.

Figure 1:
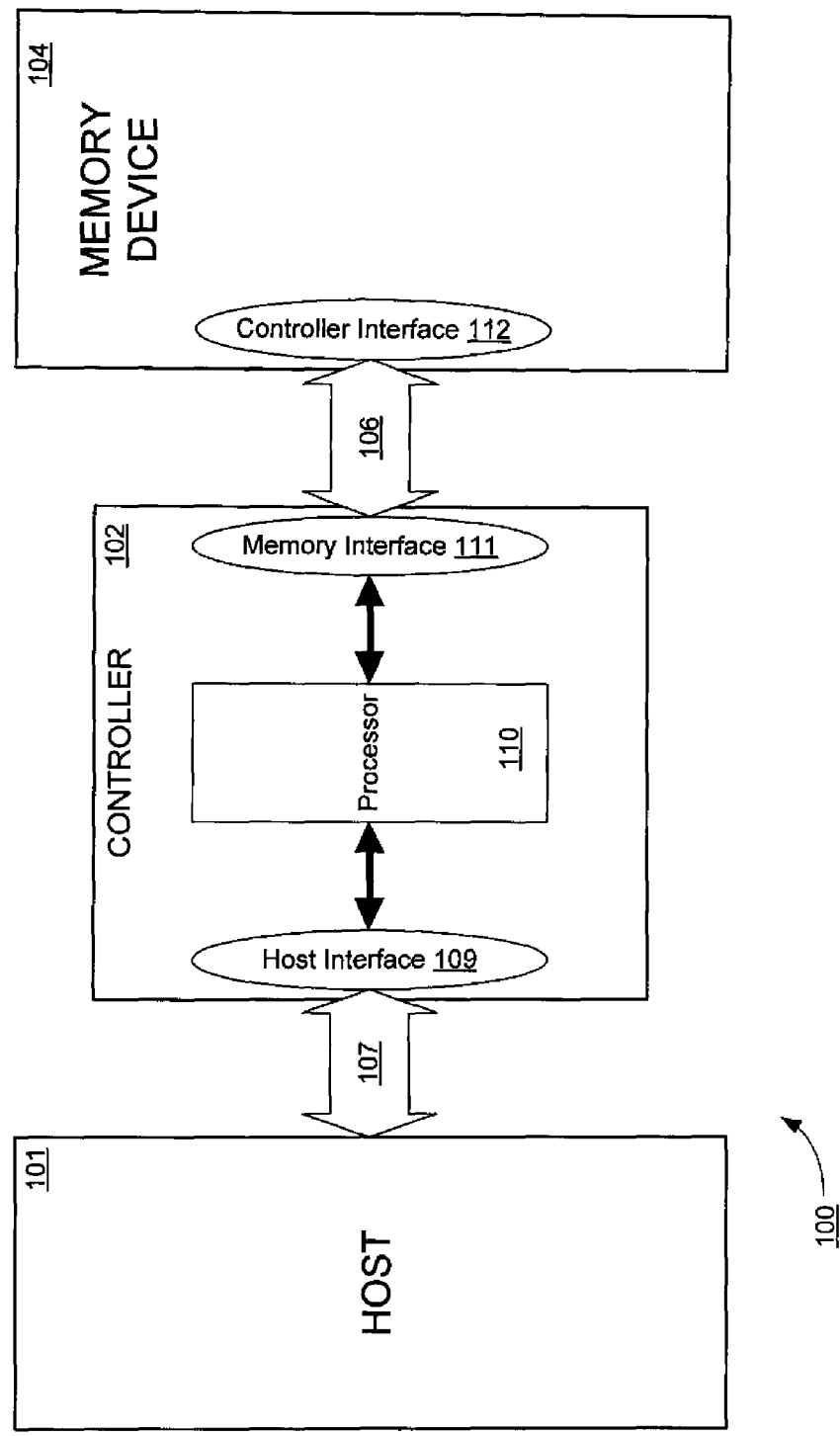
FIG. 1 shows a block diagram illustrating an exemplary system in which a multi-wire encoding scheme with an embedded clock may be implemented in accordance with an embodiment of the present disclosure.

FIG. 1 shows a block diagram illustrating an exemplary system 100 comprising a host 101, a controller 102, and a memory device 104. The controller 102 may comprise a processor 110, a host interface 109, and a memory interface 111. The memory device 104 may comprise a controller interface 112. The host interface 109 enables communications between the host 101 and the controller 102 via a first communications link 107. The memory interface 111 and the controller interface 112 coordinate with each other to enable communications between the controller 102 and the memory device 104 via a second communications link 106. The host 101 may send input/output (I/O) requests to the controller 102, and the controller 102 may process the I/O requests and execute them against the memory device 104. Specifically, the memory interface 111, the controller interface 112, and/or the second communications link 106 may be configured to support a multi-wire encoding scheme with an embedded clock.

Figure 2:
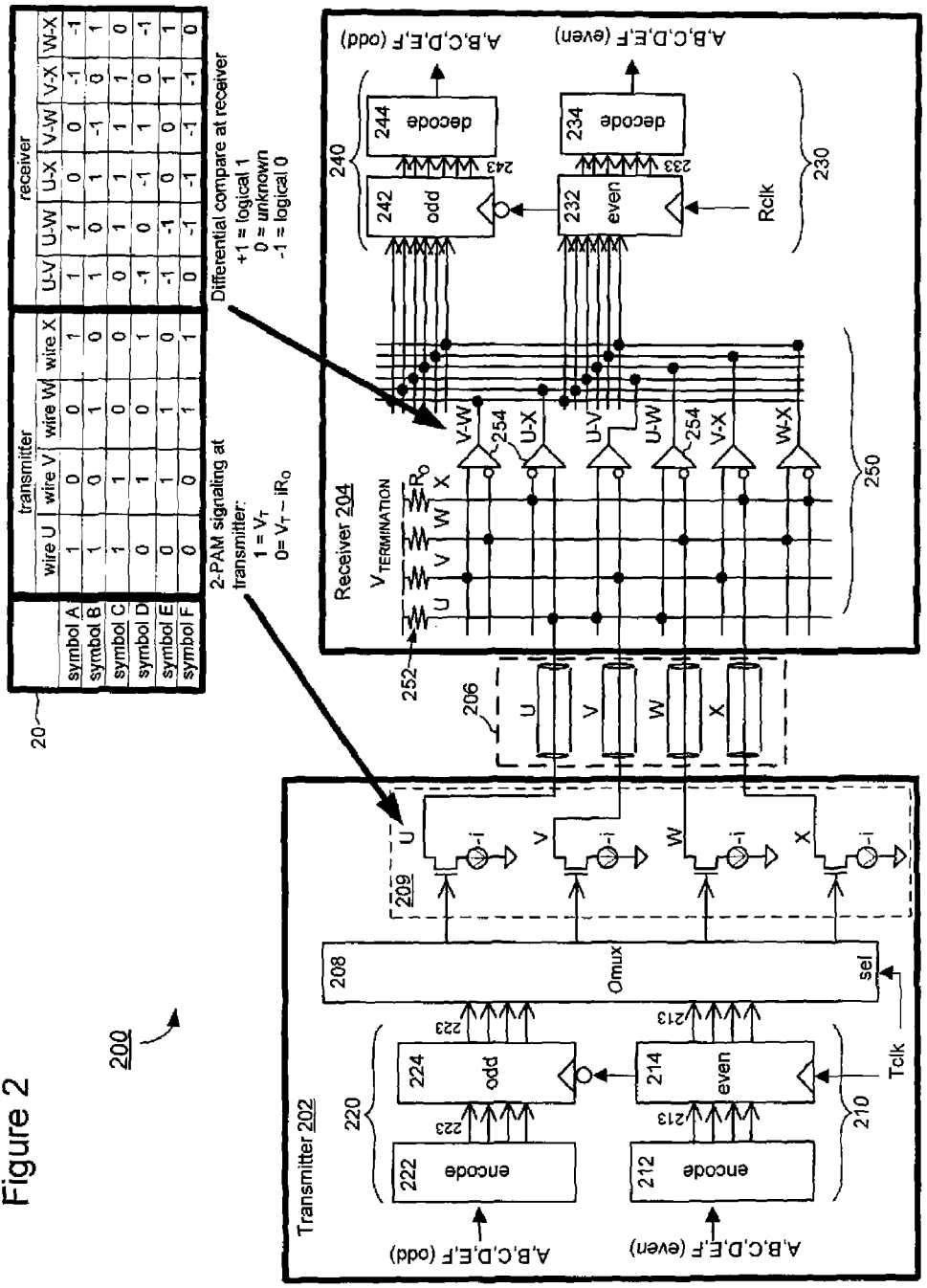
FIG. 2 shows an exemplary system implementing a 4-wire encoding scheme based on a two-level pulse amplitude modulation (2-PAM) in accordance with an embodiment of the present disclosure.

FIG. 2 shows an exemplary system 200 implementing a 4-wire encoding scheme based on a two-level pulse amplitude modulation (2-PAM) in accordance with an embodiment of the present disclosure. For ease of illustration, an encoding table 20 for the 4-wire encoding scheme is also included in FIG. 2.

The system 200 may comprise a transmitter component ("transmitter 202") and a receiver component ("receiver 204"), which are coupled to each other via a communications link 206 comprising a set of four wires which are labeled U, V, W and X, respectively.

The transmitter 202 may comprise two signal paths, wherein a first signal path 210 comprises an encoder 212 and a latch 214, and a second signal path 220 comprises an encoder 222 and a latch 224.

At any given moment, each of the encoders 212 and 222 may encode one of six symbols (A-F) according to a 4-wire encoding scheme as illustrated in the encoding table 20. That is, each of the encoders 212 and 222 may take an input symbol (i.e., any of symbols A-F), encode it by representing it with a unique combination of four 2-PAM signal levels, and then output the encoded symbol in the form of a 4-bit signal (213 or 223). The 4-bit signal (213 or 223) may ultimately be transmitted on the set of 4 wires (U through X), as will be described in detail below.

Both latches 214 and 224 may be controlled by a transmit clock (Tclk) that triggers the latch 214 on a rising edge of a Tclk cycle and triggers the latch 224 on a falling edge of the Tclk cycle. Both latches 214 and 224 may also be coupled to an output multiplexer ("Omux") 208 which selects an output of either the latch 214 or the latch 224 under the timing control of the transmit clock (Tclk). By clocking the latches 214 and 224 differently, the 4-bit output signal 213 may be selected by the output multiplexer 208 in a first half of a Tclk cycle, and the 4-bit output signal 223 may be selected by the output multiplexer 208 in a second half of the Tclk cycle.

The output multiplexer 208 is further coupled to a 2-PAM signaling circuit (or transmit circuit) 209. The 2-PAM signaling circuit 209, coupled with corresponding pull-up resistor elements 252, may produce two distinct signal levels (i.e., "zero" and "one") on corresponding wires in the communications link 206. For example, according to one embodiment, the 2-PAM signaling circuit 209 may comprise four n-type metal-oxide-semiconductor field effect transistors (NMOS transistors) each coupled to a current source having a current level i. A "zero" sensed on the gate of one of the NMOS transistors produces an output voltage of $V_T$ (or signal level "one") on the corresponding wire in the communications link 206, wherein $V_T$ (or $V_{TERMINATION}$) denotes a termination voltage applied to a terminating end of a corresponding pull-up resistor 252. A "one" sensed on the gate of one of the NMOS transistors produces a voltage level of $V_T$–$iR_0$ (or signal level "zero") on a corresponding wire in the communications link 206, wherein $R_0$ denotes a resistance value of a corresponding pull-up resistor 252. Therefore, the 2-PAM signaling circuit 209 serves a function of transmitting the 4-bit signals 213 and 223, which represent the encoded symbols, on the set of wires U through X. And, the transmission is at a double data rate since two symbols are transmitted per Tclk cycle.

Referring to the transmitter section of the encoding table 20, there are listed symbols A through F and their respective combinations of 2-PAM signal levels on wires U through X. For example, symbol A is represented by "1001" and symbol D is represented by "0101." In this particular encoding scheme, it should be noted that each signal level appears exactly twice in any given combination. This encoding method may be advantageous since it causes a total output current on wires U through X to be at a substantially constant level no matter which symbol is being transmitted on the wires, thereby avoiding ground bounces caused by current swings.

The receiver 204 may comprise a sensing circuit 250 having an array of differential sensing elements such as comparators 254. The sensing circuit 250 may detect signal differentials among two or more of the wires U through X. In this particular embodiment, a signal differential between every two wires in the communications link 206 is detected with the comparators 254. Since each wire carries one of two signal levels ("zero" or "one"), the signal differential between two wires may be "−1" (logical zero), "+1" (logical one), or "0" (unknown). The six comparison results are fed to two signal paths 230 and 240, wherein the signal path 230 comprises a latch 232 and a decoder 234, and wherein the signal path 240 comprises a latch 242 and a decoder 244.

Both latches 232 and 242 may be controlled by a receive clock (Rclk) that triggers the latch 232 on a rising edge of an Rclk cycle and triggers the latch 242 on a falling edge of the Rclk cycle. Thus, during a first half of each Rclk cycle, one 6-bit comparison signal (233) from the six comparators 254 may be clocked in by the latch 232 and fed to the decoder 234. During a second half of each Rclk cycle, another 6-bit comparison signal (243) from the six comparators 254 may be clocked in by the latch 242 and fed to the decoder 244. The decoders 234 and 244 may decode the 6-bit comparison signals 233 and 243 according to the 4-wire encoding scheme as shown in the encoding table 20.

Referring to the receiver section of the encoding table 20, there are listed symbols A through F and their respective combinations of signal differentials as sensed between every two wires U through X. Since each combination of signal differentials uniquely identifies a corresponding symbol despite the presence of "0" (unknown) states, the decoders 234 and 244 may reliably recover from the 6-bit comparison signals 233 and 243 those symbols that were originally input into the encoders 212 and 222, respectively. For example, if the 6-bit comparison signal (233 or 243) is "011110," then, based on the encoding table 20, the corresponding symbol recovered and output by the decoder (234 or 244) should be symbol C. In the decoder (234 or 244), a digital gate to detect the symbol C may be a four-input "and" gate, with the inputs connected to the U-W, U-X, V-W, and V-X inputs. The U-V and W-X inputs are not connected because they are "0" in the table (don't care).

The 4-wire encoded transmission as illustrated in FIG. 2 may be generally extended to N-wire encoded transmission based on 2-PAM, 3-PAM, or n-PAM signaling techniques, wherein N≥2 and n≥2. Compared to single-ended transmission of signals, a multi-wire encoded transmission may involve smaller crosstalk among wires, more opening of a "data eye," and smaller jitter accumulation.

Figure 3:
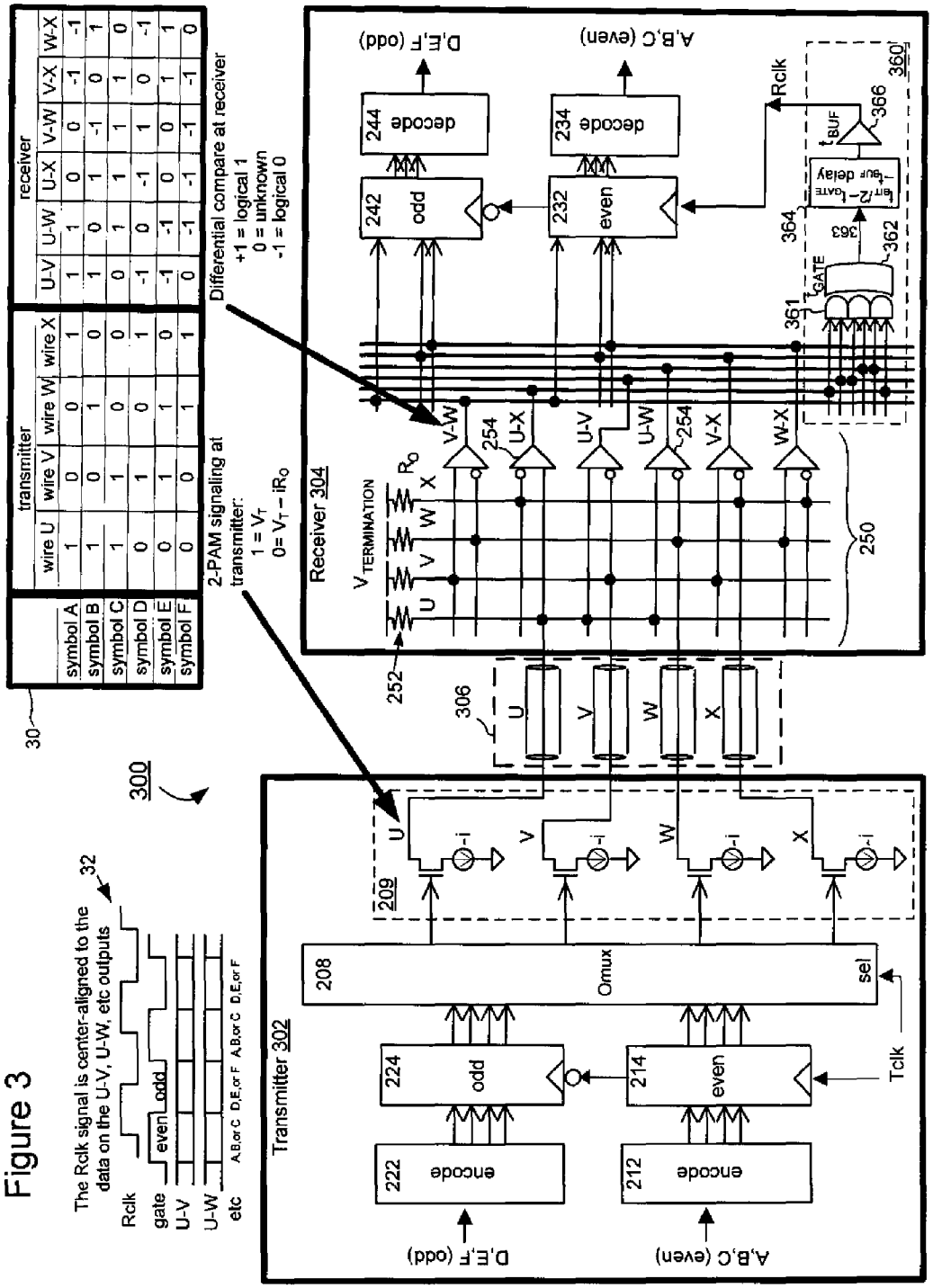
FIG. 3 shows an exemplary system implementing a 2-PAM, 4-wire encoding scheme with an embedded clock in accordance with an embodiment of the present disclosure.

FIG. 3 shows an exemplary system 300 implementing a 2-PAM, 4-wire encoding scheme with an embedded clock in accordance with an embodiment of the present disclosure. For ease of illustration, an encoding table 30 and selected signal waveforms 32 are also included in FIG. 3.

Similar to the system 200 of FIG. 2, the system 300 may comprise a transmitter 302 and a receiver 304, which are coupled to each other via a communications link 306 comprising a set of four wires which are labeled U, V, W and X, respectively. The physical structure of the transmitter 302 may be substantially the same as or similar to the transmitter 202. For illustration purposes, only those parts in the transmitter 302 and the receiver 304 that are different from their counterparts in the transmitter 202 and the receiver 204 are labeled with different reference numerals. That is, the transmitter 302 may comprise encoders (212, 222), latches (214, 224), output multiplexer 208, and 2-PAM signaling circuit (or transmit circuit) 209. The transmitter 302 may also implement a 4-wire encoding scheme based on 2-PAM signaling to encode six symbols A through F for transmission on the set of wires U through X. In such a case, the encoding table 30 may be the same as the encoding table 20.

A main difference from the transmitter 202 is that control logic (not shown) associated with the transmitter 302 may restrict the transmission of a first subset of the encoded symbols (e.g., A, B and C) to a rising edge of the transmit clock (Tclk) cycle and may restrict the transmission of a second subset of the encoded symbols (e.g., D, E and F) to a falling edge of the Tclk cycle. That is, during a first half of each Tclk cycle, only one of three encoded symbols (i.e., one of A-C) may be transmitted to the receiver 304, instead of one of six encoded symbols (i.e., one of A-F) as is the case in the system 200. Similarly, during a second half of each Tclk cycle, only one of the other three encoded symbols (i.e., one of D-F) may be transmitted to the receiver 304. These restrictions imposed on the transmission of the encoded symbols, with timing reference to the Tclk signal, serves to embed information associated with the Tclk signal into the multi-wire encoded transmission, as will be explained in detail below.

On the receiver end, similar to the receiver 204, the receiver 304 may comprise sensing circuit 250, latches (232, 242), and decoders (234, 244). The sensing circuit 250 may include six comparators 254 to detect signal differentials between every two of the four wires U through X. Due to the aforementioned restrictions imposed on the transmission of the encoded symbols A through F, the decoder 234 may only output one of three decoded symbols (i.e., A-C) during a first half of each receive clock (Rclk) cycle, and the decoder 244 may only output one of the other three decoded symbols (i.e., D-F) during a second half of each Rclk cycle.

Compared to the receiver 204, the receiver 304 may further comprise a clock recovery module 360. The clock recovery module 360 may comprise logical gates (i.e., AND gates 361 and OR gate 362) to perform logical operations on selected outputs of the comparators 254, and thereby generate a signal 363 that switches at substantially the same frequency as the Tclk signal. For example, as shown in FIG. 3, the comparison results of U-X, U-V and U-W may be paired up for AND operations by the AND gates 361. A further OR operation by the OR gate 362 on outputs of the AND gates 361 may generate the signal 363 which switches between a logical one and a logical zero as the multi-wire encoded transmission is switched between symbols A-C and symbols D-F, respectively. Effectively, the signal 363 is a raw clock signal with the Tclk frequency. The clock recovery module 360 may further comprise a delay element 364 and an inverter 366, which collectively adjust the phase of the raw clock signal 363 to generate the Rclk signal with a desired phase offset with respect to the data symbols.

According to one embodiment of the present disclosure, it may be desirable to make the Rclk signal center-aligned with the output data U-V, U-W, etc. from the comparators 254. As shown in the exemplary waveforms 32, the Rclk signal may be phase-shifted from the U-V data by half a bit time ($t_{BIT}$), wherein $t_{BIT}$ denotes the time it takes for the transmitter 302 to transmit one bit of data. To achieve this phase offset, the delay element 364 may use calibrated delay mirrors to impose a total delay of ($t_{BIT}/2-t_{GATE}-t_{BUF}$) wherein $t_{GATE}$ denotes a delay caused by the logical gates 361 and 362 and $t_{BUF}$ denotes a delay caused by the inverter 366. According to one embodiment, the clock recovery module 360 may be calibrated by connecting four such identical modules in a ring oscillator circuit. A total delay caused by the four clock recovery modules 360 may be adjusted by comparing to a reference clock having a cycle time of twice the bit time ($t_{BIT}$). An additional per-bit calibrated timing offset may be applied to each sampler to remove intra-byte timing skews.

Figure 4:
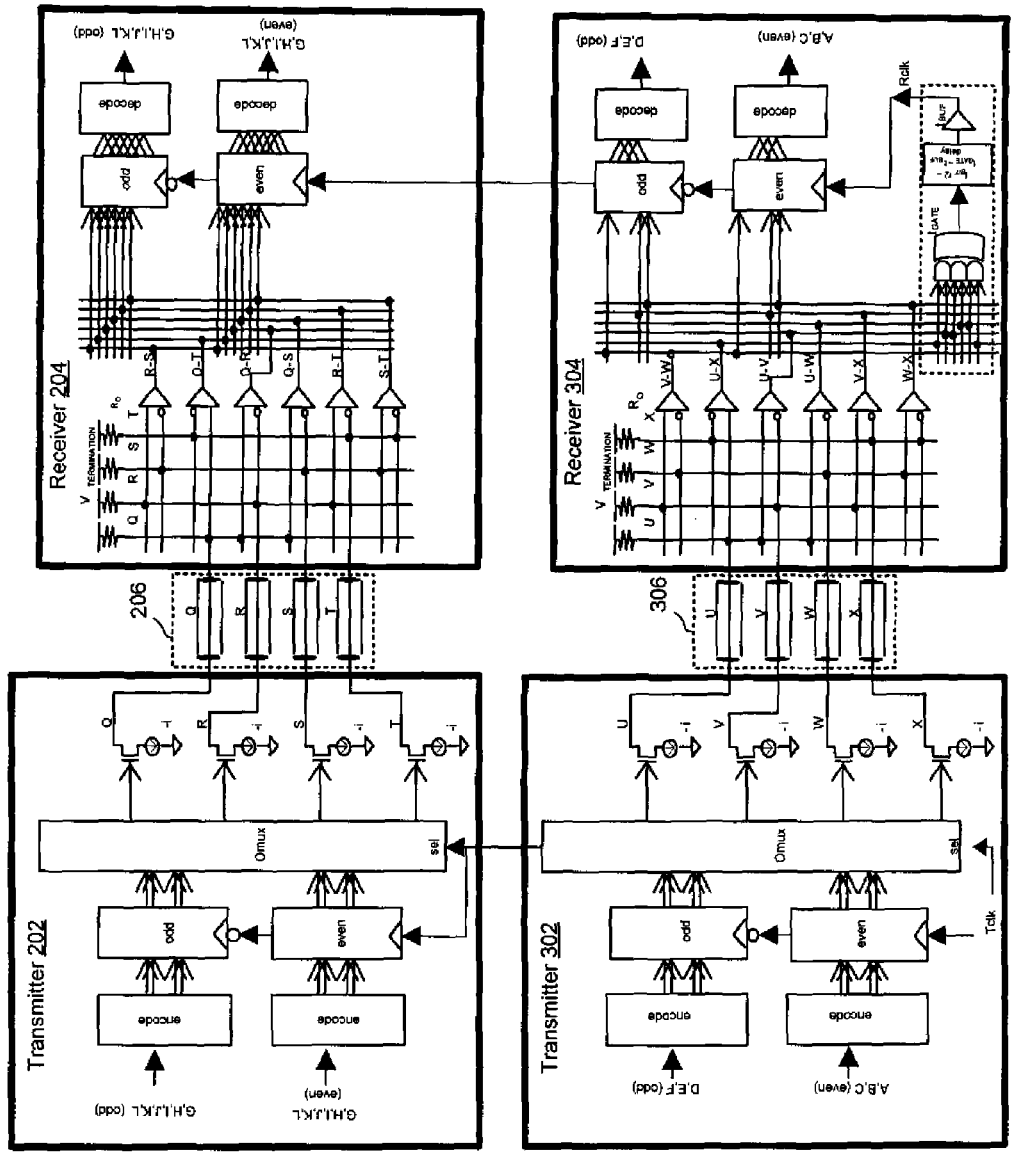
FIG. 4 shows an exemplary system including two transmitter-receiver pairs based on a 2-PAM, 4-wire encoding scheme with an embedded clock in accordance with an embodiment of the present disclosure.

FIG. 4 shows an exemplary system 400 including two transmitter-receiver pairs based on a 2-PAM, 4-wire encoding scheme with an embedded clock in accordance with an embodiment of the present disclosure. The first transmitter-receiver pair may be the system 300 of the transmitter 302 and the receiver 304 as shown in FIG. 3. The second transmitter-receiver pair may be the system 200 of the transmitter 202 and the receiver 204 as shown in FIG. 2, except that the wires in the communications link 206 are now labeled Q through T to distinguish from the wires U through X in the communications link 306. For clarity, individual parts within the two transmitter-receiver pairs are not labeled with reference numerals.

In the system 400, the transmitters 202 and 302 may share a transmit clock (Tclk) signal. On a rising edge of the Tclk signal, one of three symbols A-C may be encoded and transmitted by the transmitter 302, and one of six symbols G-L may be encoded and transmitted by the transmitter 202. On a falling edge of the Tclk signal, one of three symbols D-F may be encoded and transmitted by the transmitter 302, and one of six symbols G-L may be encoded and transmitted by the transmitter 202.

On the receiving end of the system 400, the receiver 304 may recover a receive clock (Rclk) signal from the multi-wire encoded transmission of the symbols A-F in accordance with the exemplary method described above in connection with FIG. 3. The receiver 304 may then share that Rclk signal with the receiver 204. The receivers 204 and 304 may then receive and decode the symbols A-F and G-L, respectively.

In every bit time ($t_{BIT}$), which is one half of a Tclk signal cycle, the receiver 204 receives one of six symbols (G-L) and the receiver 304 receives one of three symbols (A-C). Thus, in every bit time, the receivers 204 and 304 together see one of 18 (i.e., 6×3=18) possible combinations of symbols. Therefore, the system 400 may use the 18 combinations of symbols to represent 18 Symbols (with capital "S" to distinguish from the symbols A-F and G-L in the two transmitter-receiver pairs, respectively). 16 of the Symbols may convey 4 bits of digital data. And, there are still two extra Symbols left over to convey additional information such as, for example, a data mask (DM). In conventional memory systems, a data mask (DM) signal is sometimes used to accompany write data to indicate that certain write data is not to be written into memory. In the system 400, one extra Symbol may serve as a data mask and the other extra Symbol may be used to convey other control information.

To minimize skews among encoded symbols transmitted on the Q through T and U through X, it may be desirable to equalize the path lengths of these wires.

Figure 5:
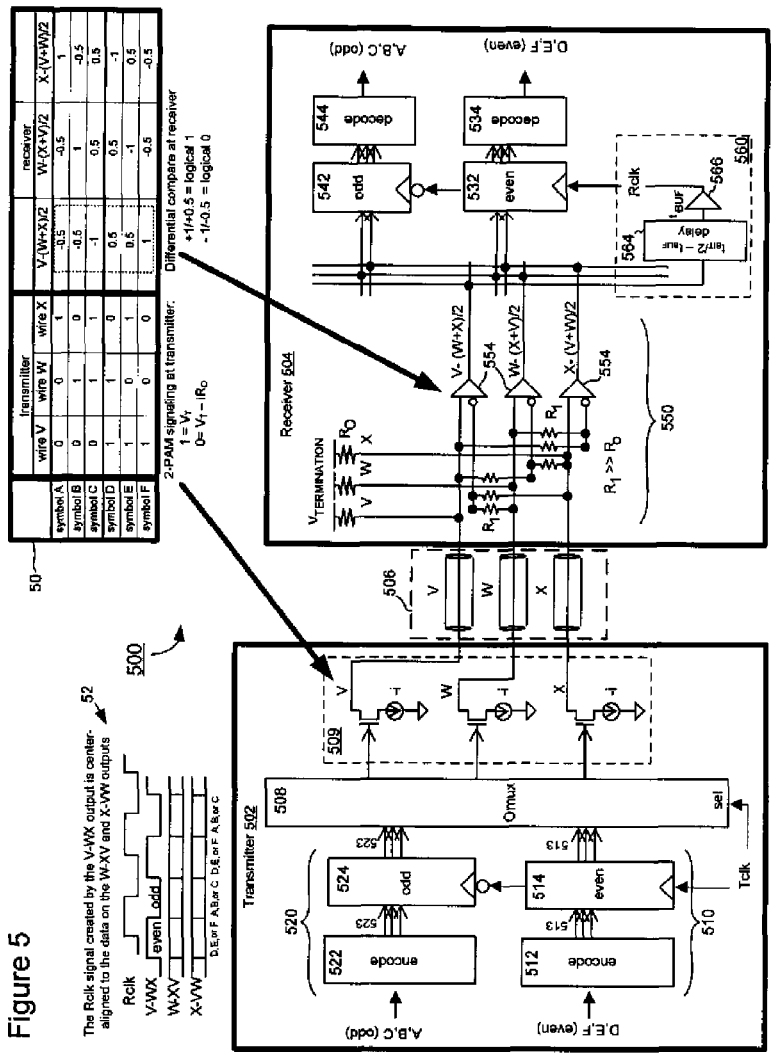
FIG. 5 shows an exemplary system implementing a 2-PAM, 3-wire encoding scheme with an embedded clock in accordance with an embodiment of the present disclosure.

FIG. 5 shows an exemplary system 500 implementing a 2-PAM, 3-wire encoding scheme with an embedded clock in accordance with an embodiment of the present disclosure. For ease of illustration, an encoding table 50 and selected signal waveforms 52 are also included in FIG. 5.

The system 500 may comprise a transmitter 502 and a receiver 504, which are coupled to each other via a communications link 506 comprising a set of three wires which are labeled V, W and X respectively. The physical structure of the transmitter 502 may be substantially the same as or similar to the transmitter 302 of FIG. 3. The transmitter 502 may comprise encoders (512, 522) and latches (514, 524) forming two signal paths (510, 520) which are coupled to an output multiplexer 508. The output multiplexer 508 is further coupled to a signaling circuit (or transmit circuit) 509.

A transmit clock (Talk) signal may provide a timing control for the latches 514 and 524 as well as the output multiplexer 508. On a rising edge of the Tclk signal, one of symbols D-F may be encoded according to a 3-wire encoding scheme as illustrated in the encoding table 50. One encoded symbol may be represented by a 3-bit signal 523 which is a combination of three 2-PAM signal levels. The 3-bit signal 513 may be selected by the output multiplexer 508 for transmission on the wires V through X to the receiver 504. Similarly, on a falling edge of the Tclk signal, one of symbols A-C may be encoded as a 3-bit signal 523 and transmitted to the receiver 504. A restriction placed on the transmission of the encoded symbols A-F may cause a clock signal to be embedded into the multi-wire encoded transmission, as will be explained below.

The receiver 504 may comprise a sensing circuit 550 having an array of differential sensing elements such as comparators 554. In this particular embodiment, three comparators 554, coupled with voltage-dividing resistors $R_1$ and pull-up resistors $R_0$ may compare the signal level of each wire with the average signal level of its neighboring two wires. For example, the 2-PAM signal level on wire V may be compared to the average of signal levels on wires W and X, resulting in a the V−(W+X)/2 output signal value as presented in the receiver section of the encoding table 50. Output signal levels of the comparators 554 may be either +1/+0.5 (logical one) or −1/−0.5 (logical zero). Thus, the V−(W+X)/2 output signal is maintained at logical zero when any of the symbols A-C is transmitted during one half of a Tclk signal cycle, and the V−(W+X)/2 output signal is maintained at logical one when any of the symbols D-F is transmitted during the other half of the Tclk signal cycle.

The receiver 504 may also comprise a clock recovery module 560, including a delay element 564 and an inverter 566. Thus, the receiver 504 may take the V−(W+X)/2 output signal, apply a delay of ($t_{BIT}/2-t_{BUF}$) to it with the delay element 564, and generate a receive clock (Rclk) signal, wherein $t_{BIT}$ denotes the time it takes for the transmitter 502 to transmit one bit of data and $t_{BUF}$ denotes a delay caused by the inverter 566. As shown in the waveforms 52, the Rclk signal created by the V−WX output signal is center-aligned to the data on the W−XV and X−VW output signals, wherein "V−WX" is short for V−(W+X)/2, "W−XV" is short for W−(X+V)/2, and "X−VW" is short for X−(V+W)/2.

The Rclk signal may be applied to latches 532 and 542 to clock the output signals from the comparators 554 to decoders 534 and 544, respectively. As a result, one of three symbols D-F is decoded during a first half of an Rclk signal cycle, and one of three symbols A-C is decoded during a second half of the Rclk signal cycle. To minimize skews among the encode symbols transmitted over the wires V, W and X, it may be desirable to equalize the path lengths of these wires.

Figure 6:
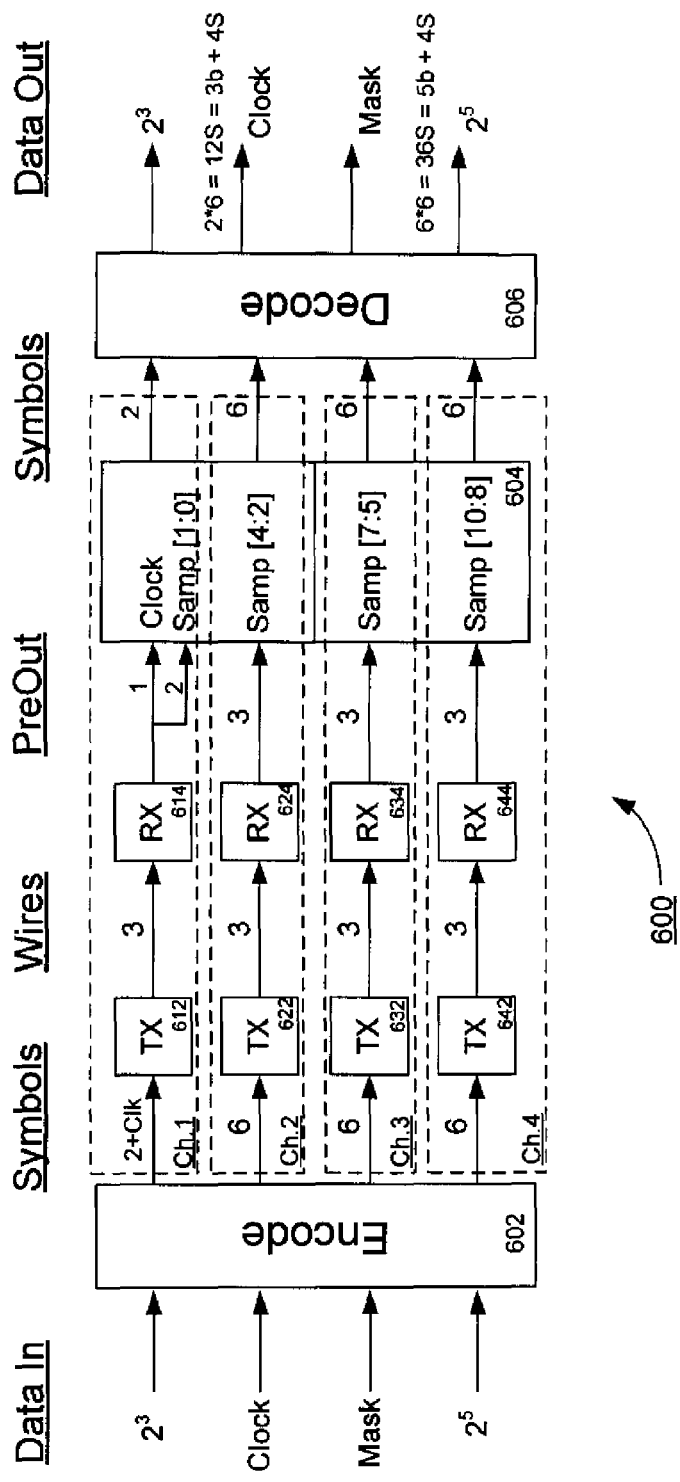
FIG. 6 shows an exemplary system including four transmitter-receiver pairs based on a 2-PAM, 3-wire encoding scheme with an embedded clock in accordance with an embodiment of the present disclosure.

FIG. 6 shows an exemplary system 600 including four transmitter-receiver pairs (i.e., 612 and 614, 622 and 624, 632 and 634, 642 and 644,) in accordance with an embodiment of the present disclosure. The system 600 may comprise an encoder module 602, a sensing circuit 604, and a decoder module 606, all of which are shared among the four transmitter-receiver pairs. The four transmitter-receiver pairs may be viewed as four parallel channels, each utilizing three wires for transmitting encoded symbols. The first channel, Ch. 1, may implement a 2-PAM, 3-wire encoding scheme with an embedded clock (Clk) in a same or similar manner as the system 500. The other three channels—Ch. 2, Ch. 3, and Ch. 4—may implement a 2-PAM, 3-wire encoding scheme without any embedded clock.

Specifically, a 3-bit data stream, a clock signal, a data mask signal, and a 5-bit data stream may be sent into the encoder 602 as inputs. The encoder 602 may encode most of these input signals into symbols, two symbols for Ch. 1 and six symbols for each of the other three channels. Compared to the system 500 in FIG. 5, only two of the three possible symbols are used in Ch. 1 because of inter-symbol interference (ISI) issues. According to some embodiments, trying to use the third symbol may reduce signal integrity, possibly lowering the signaling rate. The third symbol is not needed, since eight data bits plus mask and clock can be encoded in each bit time on the 12 wires. The clock signal may be used as a transmit clock for Ch. 1. In addition, the clock signal may serve as a timing reference to restrict the transmission of the symbols assigned to Ch. 1, thereby embedding information associated with the clock signal. The embedded clock information may be recovered by the sensing circuit 604 and used as a receive clock for the reception and decoding of all the symbols that are transmitted across the four channels. In the overall encoding scheme between the encoder 602 and the decoder 606, the system 600 may be viewed as two subgroups, the first subgroup including Ch. 1 and Ch. 2, the second subgroup including Ch. 3 and Ch. 4. Since Ch. 1 and Ch. 2 send two and six symbols, respectively, from the encoder 602 to the decoder 606, the first subgroup may output one of 2×6=12 possible combinations of symbols per bit time. The 12 possible combinations may be used to represent 12 Symbols (with capital "S" to distinguish from the underlying symbols). 8 of the Symbols may convey 3 bits of digital data. And, there are still four extra Symbols left over to convey additional information. Similarly, since each of Ch. 3 and Ch. 4 transmits six symbols, the second subgroup may output one of 6×6=36 possible combinations of symbols per bit time. The 36 possible combinations may be used to represent 36 Symbols (again with capital "S" to distinguish from the underlying symbols). 32 of the Symbols may convey 5 bits of digital data. And, there are still four extra Symbols left over to convey additional information. The 4+4=8 extra Symbols may be used to convey the data mask signal. In addition, the receiver 614 and/or the sensing circuit 604 may output the clock signal recovered from the multi-wire encoded transmission on Ch. 1 (and with possible phase adjustments).

The system 600 is one of many possible options for grouping transmitter-receiver pairs for multi-wire encoded transmissions and for sharing an embedded clock. One consideration for selecting a grouping option is inter-symbol interference (ISI). The 12-wire grouping (i.e., the four parallel channels each utilizing three wires) in the system 600 causes relatively smaller ISI than other grouping options of 2-PAM, 3-wire channels.

Figure 7:
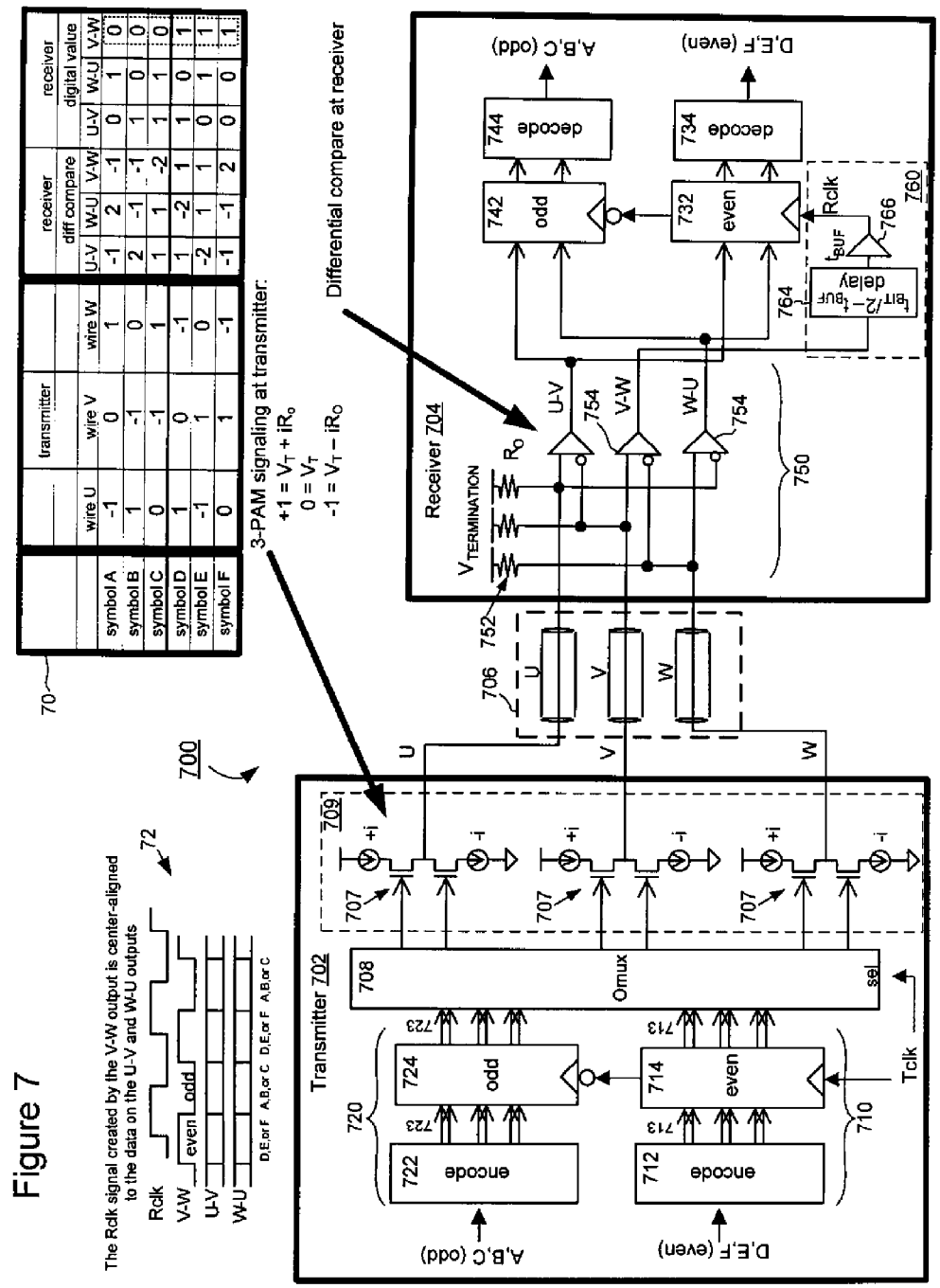
FIG. 7 shows an exemplary system implementing a 3-PAM, 3-wire encoding scheme with an embedded clock in accordance with an embodiment of the present disclosure.

FIG. 7 shows an exemplary system 700 implementing a 3-PAM, 3-wire encoding scheme with an embedded clock in accordance with an embodiment of the present disclosure. For ease of illustration, an encoding table 70 and selected signal waveforms 72 are also included in FIG. 7.

The system 700 may comprise a transmitter 702 and a receiver 704, which are coupled to each other via a communications link 706 comprising a set of three wires which are labeled U, V, and W, respectively. The physical structure of the transmitter 702 may be substantially the same as or similar to the transmitter 502 of FIG. 5. The transmitter 702 may comprise encoders (712, 722) and latches (714, 724) forming two signal paths (710, 720), which are coupled to an output multiplexer 708. The output multiplexer 708 is further coupled to a signaling circuit (or transmit circuit) 709.

The signaling circuit 709, coupled to pull-up resistor elements 752 in the receiver 704, may produce three distinct signal levels on each of the three wires in the communications link 706. For example, according to one embodiment, the 3-PAM signaling circuit 709 may comprise three 3-PAM signaling elements 707, each including two NMOS transistors and two current sources in series, wherein the two current sources have current levels +i and −i, respectively, If at least one of two NMOS transistors senses a "one" on its gate, the signaling element 707 may produce one of three possible output voltages on the corresponding wire in the communications link 706: $V_T+iR_0$ (or signal level "+1"), $V_T$ (or signal level "0"), or $V_T-iR_0$ (or signal level "−1"), wherein $V_T$ (or $V_{TERMINATION}$) denotes a termination voltage applied to the pull-up resistors 752 and $R_0$ denotes a resistance value of each pull-up resistor 752. Alternatively, a PMOS device may be use in place of the upper NMOS transistor in each of the 3-PAM signaling elements 707. Also, voltage mode drivers may be used instead of the current sources.

A transmit clock (Tclk) signal may provide a timing control for the latches 714 and 724 as well as the output multiplexer 708. On a rising edge of the Tclk signal, one of symbols D-F may be encoded according to a 3-wire encoding scheme as illustrated in the encoding table 70. One encoded symbol may be represented by a 3-bit signal 713 which is a combination of three 3-PAM signal levels. The 3-bit signal 713 may be selected by the output multiplexer 708 for transmission on the wires U through W to the receiver 704. Similarly, on a falling edge of the Tclk signal, one of symbols A-C may be encoded as a 3-bit signal 723 and transmitted to the receiver 704. In this encoding scheme, as shown in the transmitter section of the encoding table 70, each of the 3-PAM signal levels may be used exactly once in each combination that represent s an encoded symbol. A restriction placed on the encoding and transmission of the symbols A-F may cause a clock signal to be embedded into the multi-wire encoded transmission, as will be explained below.

The receiver 704 may comprise a sensing circuit 750 having an array of differential sensing elements such as comparators 754. In this particular embodiment, three comparators 754 may compare the signal levels of every two wires. Since each of the three wires U through W carries one of 3-PAM signal levels that is different from the other wires, the signal differential between any two wires may be −2 (logical zero), −1 (logical zero), +1 (logical one), or +2 (logical one), as shown in the "receiver–differential compare" section of the encoding table 70. It so happens that the signal differential V-W maintains a logical zero when any of the symbols A-C is transmitted during one half of a Tclk signal cycle, and the signal differential V-W maintains a logical one when any of the symbols D-F is transmitted during the other half of the Tclk signal cycle.

The receiver 704 may comprise a clock recovery module 760, including a delay element 764 and an inverter 766. Thus, the receiver 704 may take the signal differential V-W, apply a delay of $(t_{BIT}/2-t_{BUF})$ to it with the delay element 764, and generate a receive clock (Rclk), wherein $t_{BIT}$ denotes the time it takes for the transmitter 702 to transmit one bit of data and $t_{BUF}$ denotes a delay caused by the inverter 766. An additional per-bit timing offset can be applied to remove intra-byte timing skews. As shown in the waveforms 72, the Rclk signal created by the V-W signal differential is center-aligned to the data on the U-V and W-U signal differentials.

The Rclk signal may be applied to latches 732 and 742 to clock the output signals from the comparators 754 to decoders 734 and 744, respectively. As a result, one of three symbols D-F is decoded during a first half of an Rclk signal cycle, and one of three symbols A-C is decoded during a second half of the Rclk signal cycle. To minimize skews among the encode symbols transmitted over the wires U, V and W, it may be desirable to equalize the path lengths of these wires.

Figure 8:
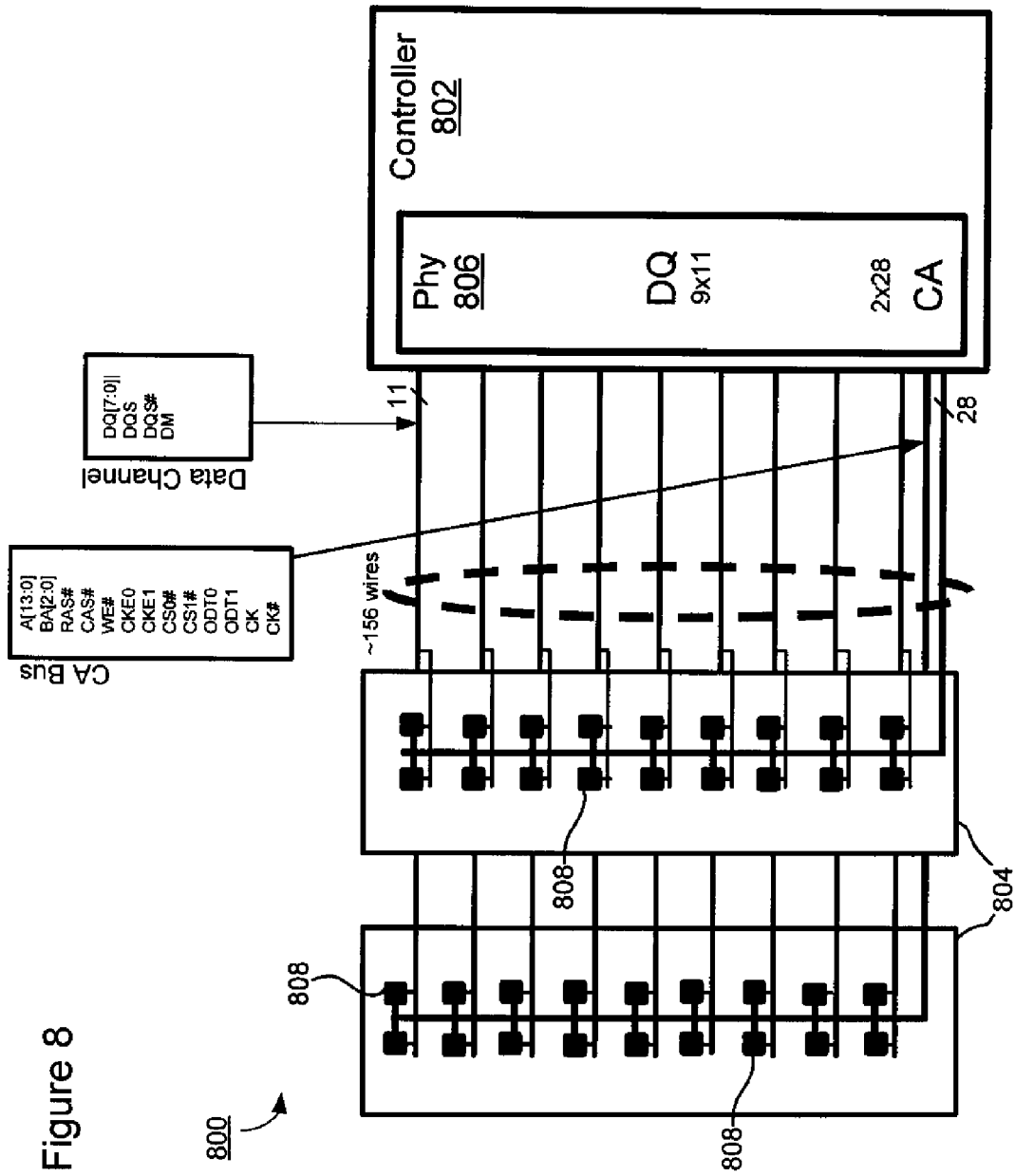
FIG. 8 shows a conventional double-data-rate (DDR) memory system.

FIG. 8 shows a conventional double-data-rate (DDR) memory system 800. The system 800 may comprise a controller 802 and two memory modules 804. There may be 18 DRAM blocks 808 on each of the memory modules 804. The controller 802 may comprise a physical interface 806 to communicate with the memory modules 804 over nine data channels and two control addressing (CA) buses.

Each data channel may be coupled to 4 DRAM blocks, two on each memory module 804. Each data channel may include 11 wires that carry eight bits of DQ data (DQ[7:0]), differential strobe signals (DQS, DQS#), and a data mask (DM). The data channels may have a bandwidth of 12.8 GB/s per channel or 1.6 Gb/s per wire.

Each CA bus may include 28 wires that carry control and address information such as a 14-bit address (A[13:0]) and differential clock inputs (CK, CK#). Each CA bus may be coupled to 18 DRAM blocks in one memory module 804. The CA buses may have a bandwidth of 0.8 Gb/s per wire.

Altogether, there may be approximately 156 wires involved in communications between the controller 802 and the two memory modules 804.

Figure 9:
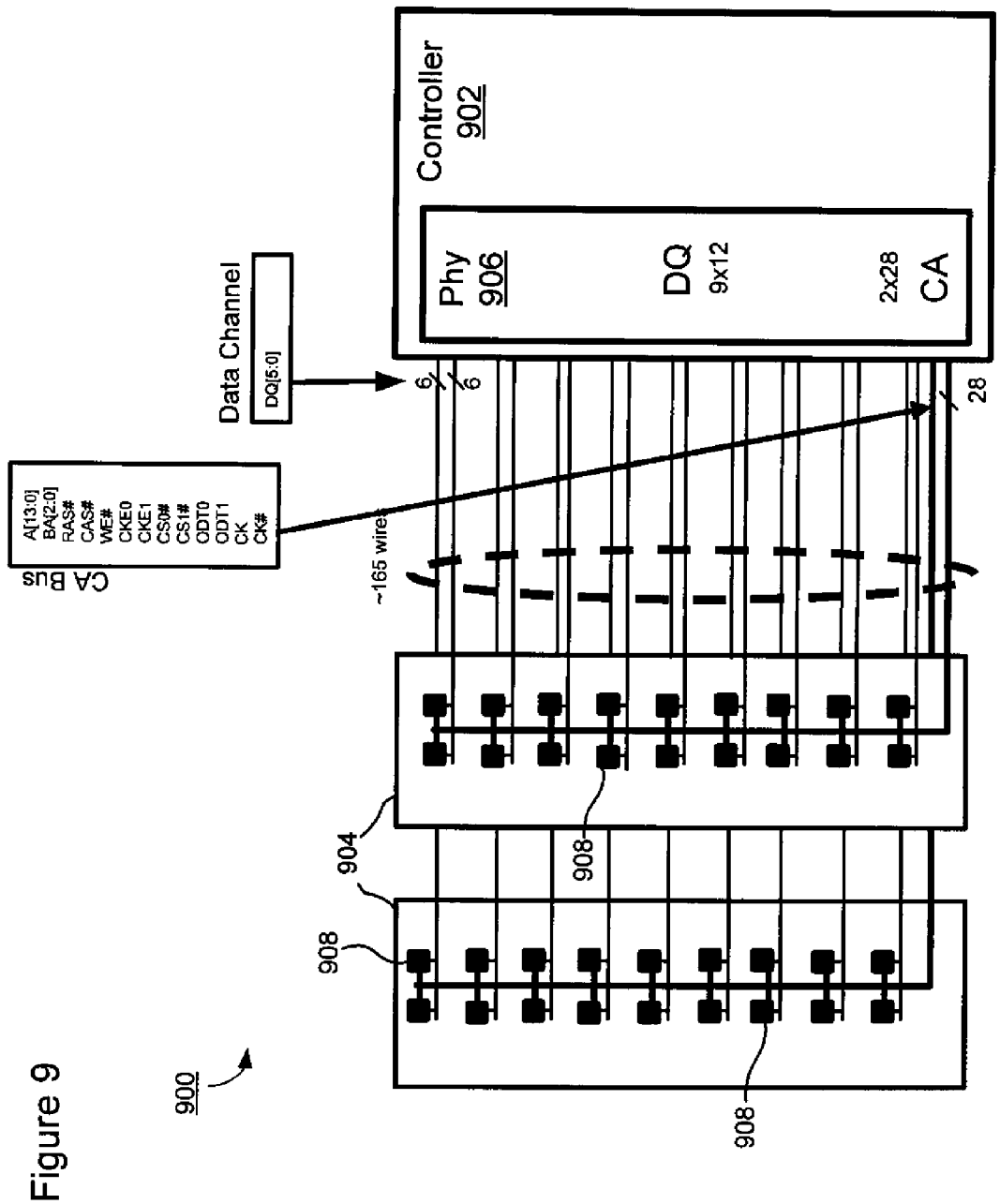
FIG. 9 shows an exemplary DDR memory system implementing a multi-wire encoding scheme with embedded clocks in accordance with an embodiment of the present disclosure.

FIG. 9 shows an exemplary DDR memory system 900 implementing a multi-wire encoding scheme with embedded clocks in accordance with an embodiment of the present disclosure. The system 900 may comprise a controller 902 and two memory modules 904. There may be 18 DRAM blocks 908 on each of the memory modules 904. The controller 902 may comprise a physical interface 906 to communicate with the memory modules 904 over nine data channels and two control addressing (CA) buses.

Each data channel may include two 6-wire groups with each group coupled to a pair of DRAM blocks on one memory module 904. Each 6-wire group may carry multi-wire encoded transmissions of symbols with an embedded clock. With 6 wires, each pair of DRAM blocks may receive differential signals of DQ data, clock and data mask. 4 DQ data bits are transmitted per bit interval, with extra symbols to convey additional information. The data channels may have a bandwidth of 50 GB/s per channel or 6.4 Gb/s per wire, which is about four times the bandwidth of the data channels in the system 800.

Each CA bus may include 28 wires that carry control and address information such as a 14-bit address (A[13:0]) and differential clock inputs (CK, CK#). Each CA bus may be coupled to 18 DRAM blocks in one memory module 904. The CA buses may have a bandwidth of 0.8 Gb/s per wire.

Altogether, there may be approximately 165 wires involved in communications between the controller 902 and the two memory modules 904. By implementing a multi-wire encoding scheme with embedded clocks, the system 900 manages to significantly increase bandwidth over the system 800 with only a small increase of wires.

Figure 10:
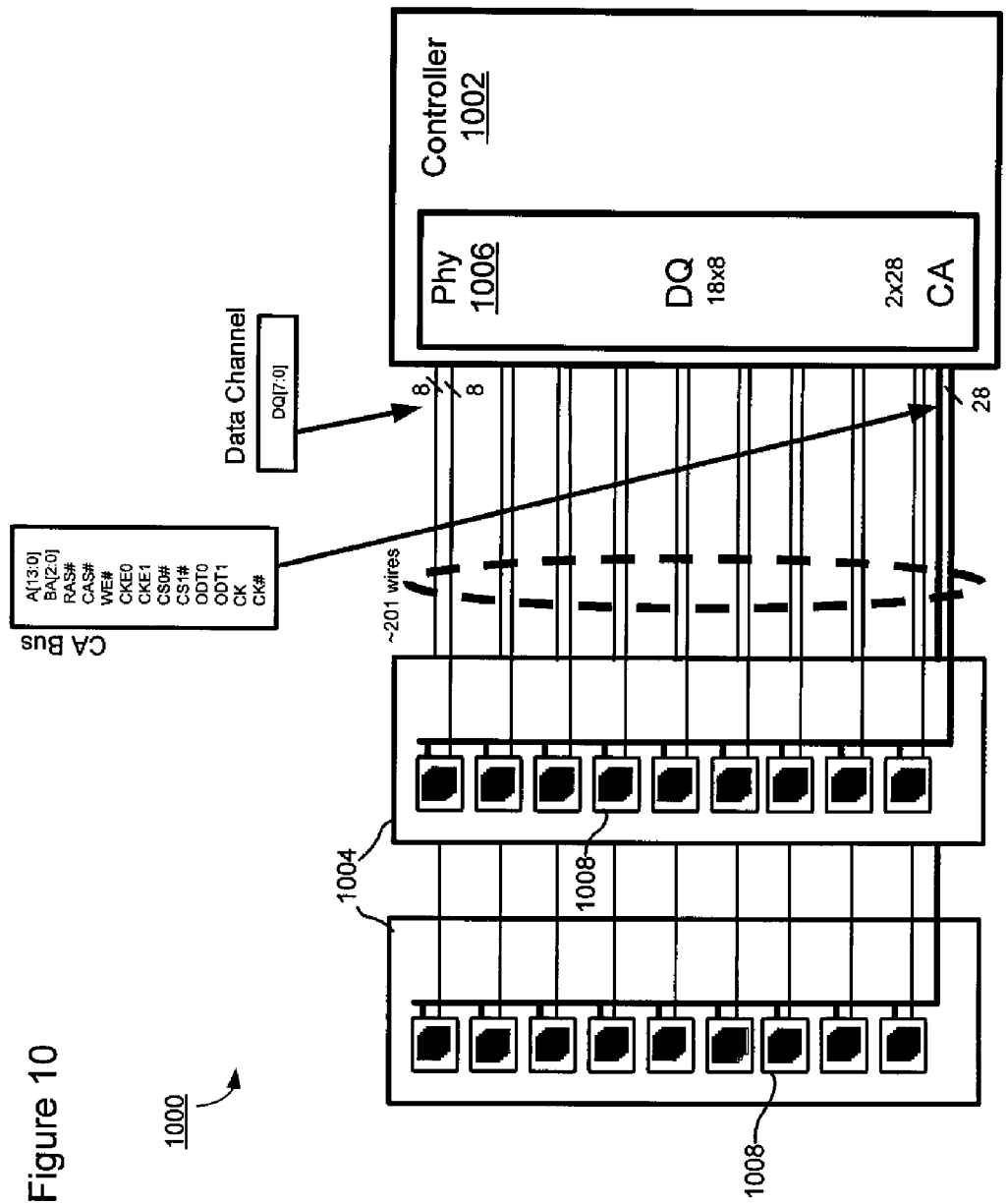
FIG. 10 shows another exemplary DDR memory system implementing micro-buffers and a multi-wire encoding scheme with embedded clocks in accordance with an embodiment of the present disclosure.

FIG. 10 shows another exemplary DDR memory system 1000 implementing micro-buffers and a multi-wire encoding scheme with embedded clocks in accordance with an embodiment of the present disclosure. The system 1000 may comprise a controller 1002 and two memory modules 1004. Each of the memory modules 1004 may include 9 micro-DRAM elements (uDRAMs) 1008. Each of the uDRAMs 1008 may include one micro-buffer (uBuffer) and four DRAM blocks. The controller 1002 may comprise a physical interface 1006 to communicate with the memory modules 1004 over nine data channels and two control addressing (CA) buses.

Each data channel may include two 8-wire groups with each group coupled to one uDRAM 1008 on one memory module 1004. Each 8-wire group may carry multi-wire encoded transmissions of symbols with an embedded clock. With 8 wires, each uDRAM 1008 may receive differential signals of DQ data, clock and data mask. 4 DQ data bits are transmitted per bit interval, with extra symbols to convey additional information. The data channels may have a bandwidth of 64 GB/s per channel or 8.0 Gb/s per wire, which is yet another improvement over the bandwidth of the system 900.

Each CA bus may include 28 wires that carry control and address information such as a 14-bit address (A[13:0]) and differential clock inputs (CK, CK#). Each CA bus may be coupled to 9 uDRAMs 1008 in one memory module 1004. The CA buses may have a bandwidth of 2.0 Gb/s per wire.

Altogether, there may be approximately 201 wires involved in communications between the controller 1002 and the two memory modules 1004. By implementing the multi-wired encoding scheme with embedded clocks and micro-buffers, the system 1000 can further improve its bandwidth over the system 900 with only a few additional wires.

At this point it should be noted that the techniques for multi-wire encoding with an embedded clock in accordance with the present disclosure as described above typically involves the processing of input data and the generation of output data to some extent. This input data processing and output data generation may be implemented in hardware or software. For example, specific electronic components may be employed in a semiconductor memory or similar or related circuitry for implementing the functions associated with multi-wire encoding with an embedded clock in accordance with the present disclosure as described above. Alternatively, one or more processors operating in accordance with stored instructions may implement the functions associated with multi-wire encoding with an embedded clock in accordance with the present disclosure as described above. If such is the case, it is within the scope of the present disclosure that such instructions may be stored on one or more processor readable carriers (e.g., a magnetic disk), or transmitted to one or more processors via one or more signals.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. A system for multi-wire encoding with an embedded clock, the system comprising:
   a first transmitter component, a first receiver component, and a first set of wires coupling the first transmitter component to the first receiver component;
   the first transmitter component being configured to:
      encode a first set of symbols by representing each symbol with a combination of signal levels transmitted on the first set of wires, and
      restrict the transmission of a first subset of the encoded symbols to a first portion of a clock cycle of a transmit clock and to restrict the transmission of a second subset of the encoded symbols to a second portion of the clock cycle of the transmit clock so as to embed a clock signal therein, the clock signal having a same frequency as the transmit clock; and the first receiver component being configured to:
- perform comparisons among the signal levels of the first set of wires, each comparison involving at least two wires,
- generate a receive clock from the embedded clock signal based on at least one of the comparisons, the receive clock having the same frequency as the transmit clock, and
- decode, under timing control of the receive clock, the encoded symbols based on the comparisons;

a second transmitter component, a second receiver component, and a second set of wires coupling the second transmitter component to the second receiver component;

the second transmitter component being configured to encode a second set of symbols by representing each symbol with a combination of signal levels transmitted on the second set of wires; and the second receiver component being configured to receive and decode the second set of encoded symbols under timing control of the receive clock;

wherein the transmission of the first set and the second set of wires are grouped to reduce inter-symbol interference among the first set and the second set of encoded symbols.

2. The system of claim 1, wherein each encoded symbol of the first set of symbols is represented by a respective combination of signal levels on at least three of the set of wires.

3. The system of claim 2, wherein each encoded symbol of the first subset of the encoded symbols corresponds to a respective one of a plurality of possible bit patterns of a set of input symbols and each encoded symbol of the second subset of the encoded symbols corresponds to a respective one of the plurality of possible bit patterns of the set of input symbols.

4. The system of claim 2, wherein a total output current on the first set of wires is substantially independent of the encoded symbols being transmitted on the wires during respective time periods.

5. The system of claim 2, wherein the signal levels are generated based on a two-level pulse amplitude modulation (2-PAM).

6. The system of claim 1, wherein the first transmitter comprises first and second encoders that are enabled to encode the first set of the encoded symbols, the first encoder outputting encoded symbols from the first subset of the encoded symbols and the second encoder outputting encoded symbols from the second subset of the encoded symbols.

7. The system of claim 1, wherein:
- encoded symbols from the first subset of the encoded symbols are transmitted on respective rising edges of the transmit clock; and
- encoded symbols from the second subset of the encoded symbols are transmitted on respective falling edges of the transmit clock.

8. The system of claim 1, wherein the first subset of the encoded symbols includes three encoded symbols, the second subset of the encoded symbols includes three encoded symbols, and the set of wires includes four wires.

9. The system of claim 1, wherein the first subset of the encoded symbols includes three encoded symbols, the second subset of the encoded symbols includes three encoded symbols, and the set of wires includes three wires.

10. The system of claim 1, wherein the first set of wires comprise traces disposed on a printed circuit board.

11. The system of claim 1, wherein signal levels representative of the encoded symbols are generated based on a three-level pulse amplitude modulation (3-PAM).

12. The system of claim 1, wherein each of the sequence of encoded symbols has a first number of data bits and each of a sequence of input symbols has a second number of data bits, the first number being at least one more than the second number.

13. The system of claim 1, wherein the first transmitter component communicates with a memory device over the first set of wires.

14. The system of claim 1, further comprising:
- multiple pairs of the first transmitter component and the first receiver component, wherein, in each pair, the first transmitter component is part of a physical interface of a memory controller and the first receiver component is associated with a micro-buffer of at least one memory module within a memory device that is coupled to the memory controller.

* * * * *